(12) United States Patent
Wu et al.

(10) Patent No.: US 9,865,536 B2
(45) Date of Patent: *Jan. 9, 2018

(54) ELECTRICAL FUSE STRUCTURE AND METHOD OF FORMATION

(71) Applicant: Taiwan Semiconductor Manufacturing Company, Ltd., Hsin-Chu (TW)

(72) Inventors: Shien-Yang Wu, Jhudong Town (TW); Wei-Chang Kung, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 67 days.

This patent is subject to a terminal disclaimer.

(21) Appl. No.: 14/231,231

(22) Filed: Mar. 31, 2014

(65) Prior Publication Data

US 2014/0203396 A1     Jul. 24, 2014

Related U.S. Application Data

(63) Continuation of application No. 12/771,768, filed on Apr. 30, 2010, now Pat. No. 8,686,536.

(60) Provisional application No. 61/256,792, filed on Oct. 30, 2009, provisional application No. 61/308,588, filed on Feb. 26, 2010.

(51) Int. Cl.
*H01L 23/52* (2006.01)
*H01L 23/525* (2006.01)

(52) U.S. Cl.
CPC .. *H01L 23/5256* (2013.01); *H01L 2924/0002* (2013.01)

(58) Field of Classification Search
CPC ......... H01L 2924/0002; H01L 2924/00; H01L 23/5256; H01L 23/5226
See application file for complete search history.

(56) References Cited

U.S. PATENT DOCUMENTS

| | | | |
|---|---|---|---|
| 5,212,102 A | 5/1993 | Iranmanesh et al. | |
| 5,244,836 A | 9/1993 | Lim | |
| 5,427,979 A | 6/1995 | Chang | |
| 5,472,901 A | 12/1995 | Kapoor | |
| 5,538,924 A | 7/1996 | Chen | |
| 5,573,970 A | 11/1996 | Pramanik et al. | |
| 5,618,750 A | 4/1997 | Fukuhara et al. | |
| 5,702,982 A | 12/1997 | Lee et al. | |
| 5,854,510 A | 12/1998 | Sur, Jr. et al. | |
| 5,879,982 A | 3/1999 | Park et al. | |

(Continued)

FOREIGN PATENT DOCUMENTS

JP     2006-013338     12/2006

OTHER PUBLICATIONS

German Patent and Trademark Office, German Patent Office Action dated Oct. 17, 2016, for Application No. 10 2010 045 073.1, 6 pages.

*Primary Examiner* — Meiya Li
(74) *Attorney, Agent, or Firm* — Haynes and Boone, LLP

(57) ABSTRACT

An embodiment is a fuse structure. In accordance with an embodiment, a fuse structure comprises an anode, a cathode, a fuse link interposed between the anode and the cathode, and cathode connectors coupled to the cathode. The cathode connectors are each equivalent to or larger than about two times a minimum feature size of a contact that couples to an active device.

19 Claims, 8 Drawing Sheets

(56) References Cited

U.S. PATENT DOCUMENTS

| | | |
|---|---|---|
| 5,882,998 A | 3/1999 | Sur, Jr. et al. |
| 5,907,788 A | 5/1999 | Kasai |
| 5,953,635 A | 9/1999 | Andideh |
| 5,970,346 A | 10/1999 | Liaw |
| 5,989,784 A | 11/1999 | Lee et al. |
| 6,027,999 A | 2/2000 | Wong |
| 6,078,088 A | 6/2000 | Buynoski |
| 6,162,686 A | 12/2000 | Huang et al. |
| 6,242,790 B1 | 6/2001 | Tsui et al. |
| 6,277,674 B1 | 8/2001 | Wang et al. |
| 6,433,404 B1 | 8/2002 | Iyer et al. |
| 6,436,738 B1 | 8/2002 | Yu |
| 6,642,601 B2 | 11/2003 | Marshall et al. |
| 6,661,330 B1 | 12/2003 | Young |
| 6,670,824 B2 | 12/2003 | Goodbread et al. |
| 7,109,564 B2 | 9/2006 | Wu et al. |
| 7,642,176 B2 | 1/2010 | Cheng et al. |
| 8,686,536 B2 * | 4/2014 | Wu ............. H01L 23/5256 257/173 |
| 2005/0189613 A1 * | 9/2005 | Otsuka ........... H01L 23/5256 257/529 |
| 2005/0285222 A1 | 12/2005 | Thei et al. |
| 2005/0285224 A1 * | 12/2005 | Tsutsui ........... H01L 23/5256 257/531 |
| 2007/0210413 A1 * | 9/2007 | Booth ............ H01L 23/5256 257/529 |
| 2007/0298526 A1 | 12/2007 | Berry et al. |
| 2008/0029843 A1 | 2/2008 | Booth, Jr. et al. |
| 2008/0186788 A1 | 8/2008 | Barth |
| 2008/0211059 A1 | 9/2008 | Kwon et al. |
| 2009/0021338 A1 | 1/2009 | Kim et al. |
| 2009/0231020 A1 | 9/2009 | Kubota |
| 2009/0243032 A1 | 10/2009 | Chen |
| 2009/0261450 A1 | 10/2009 | Cheng et al. |
| 2009/0283853 A1 | 11/2009 | Huebinger |
| 2010/0090751 A1 | 4/2010 | Cheng et al. |
| 2014/0319651 A1 | 10/2014 | Wu et al. |

* cited by examiner

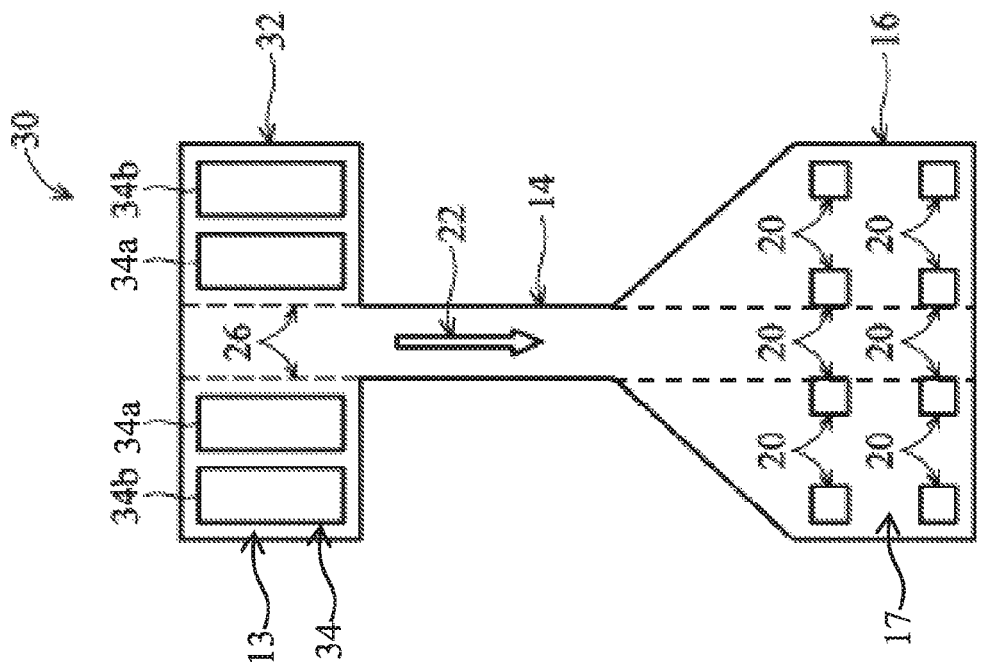
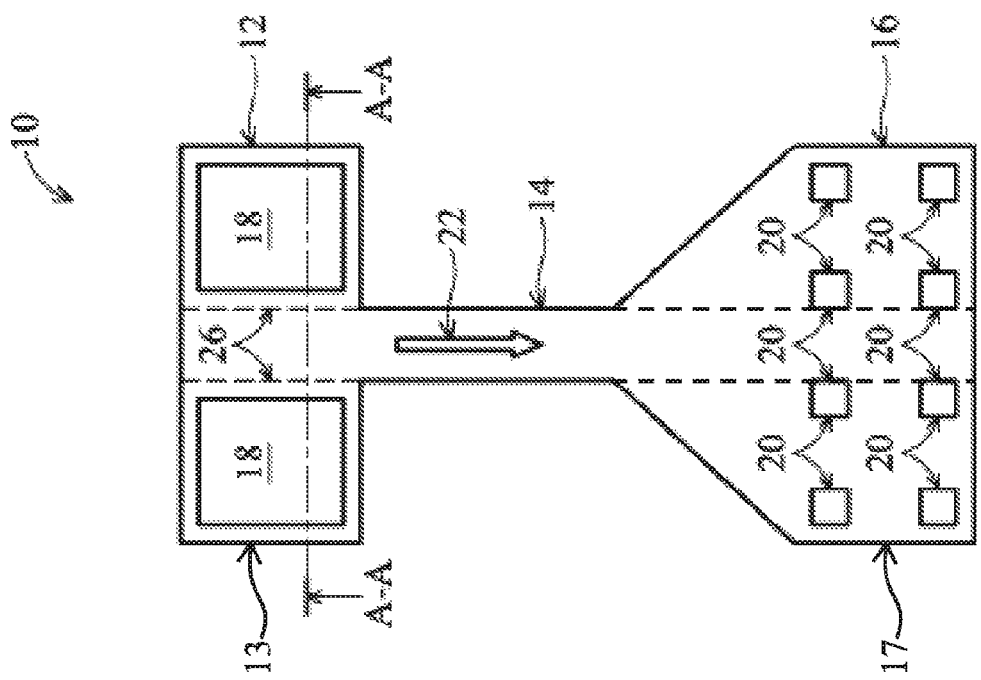

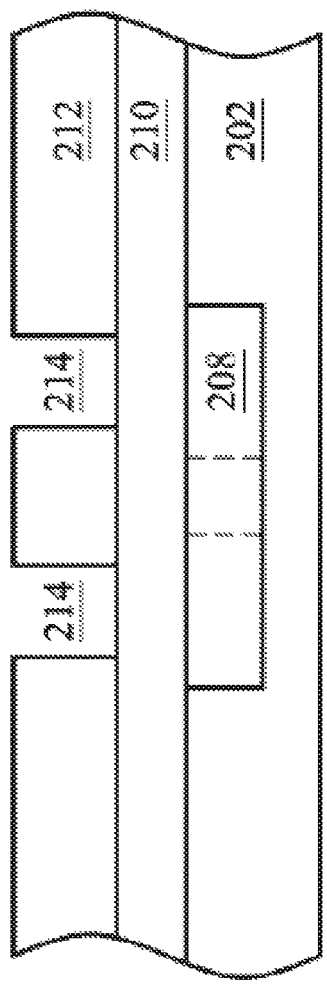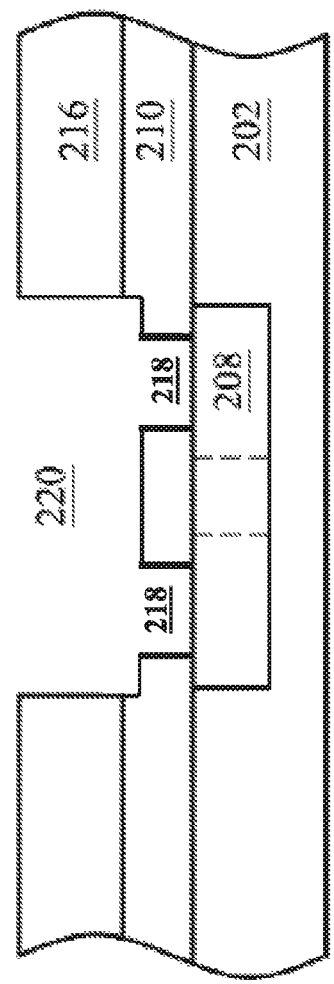

ELECTRICAL FUSE STRUCTURE AND METHOD OF FORMATION

PRIORITY DATA

The present application is a continuation of U.S. Ser. No. 12/771,768, filed on Apr. 30, 2010, entitled "Electrical Fuse Structure and Method of Formation", now U.S. Pat. No. 8,686,536, which claims the benefit of U.S. Provisional Patent Application Ser. No. 61/256,792, filed on Oct. 30, 2009, and entitled "Electrical Fuse Structure and Method of Formation," and U.S. Provisional Patent Application Ser. No. 61/308,588, filed Feb. 26, 2010, and entitled "Electrical Fuse Structure and Method of Formation", the entire disclosure of each of which is incorporated herein by reference in its entirety.

TECHNICAL FIELD

The disclosure relates generally to a fuse structure and method of forming the fuse structure and, more particularly, to an electrical fuse in a semiconductor device and method of forming the electrical fuse.

BACKGROUND

In the semiconductor industry, fuse elements are widely used features in integrated circuits for a variety of purposes, such as in memory repair, analog resistor trimming, and chip identification. For example, by replacing defective memory cells on chips with redundant cells on the same chips, memory manufacturing yields can be significantly increased. A fuse disconnected by a laser beam is referred to as a laser fuse, and a fuse disconnected by passing an electrical current, or blowing, is referred to as an electrical fuse, or e-fuse. By selectively blowing fuses within an integrated circuit that has multiple potential uses, a generic integrated circuit design may be economically manufactured and adapted to a variety of custom uses.

E-fuses may be incorporated in the design of integrated circuits, wherein the fuses are selectively blown, for example, by passing an electrical current of a sufficient magnitude to cause electro-migration or melting of a fuse link, thereby creating a more resistive path or an open circuit. However, a contact to a cathode of a conventional fuse may cause problems when a large electrical current passes through the fuse. This contact is generally aligned with an axis of a fuse link and nearest to the fuse link and has a very small contact area. Because the contact is nearest to and aligned with the fuse link, the resistance between the fuse link and the contact is much lower than any resistance between the fuse link and any other contacts in the cathode. This low resistance may cause a large proportion of the electrical current to flow through the contact.

The larger electrical current flowing through the contact may cause electro-migration of the metal in the contact to the fuse link. The electro-migration of the metal then may cause the fuse link to short circuit again when the large electrical current was intended to create a more resistive path or open circuit. This problem is increased after a high temperature storage (HTS) or bake process of the chip. Accordingly, there is a need in the art for a more robust fuse structure to overcome the deficiencies of the prior art.

SUMMARY

In accordance with an embodiment, a fuse structure comprises an anode, a cathode, a fuse link interposed between the anode and the cathode, and cathode connectors coupled to the cathode. The cathode connectors are each equivalent to or larger than about two times a minimum feature size of a contact that couples to an active device.

In accordance with another embodiment, a fuse structure comprises an anode, a cathode with connectors coupled to the cathode, and a fuse link coupled between the cathode and the anode. A cross-section area of each of the connectors is equal to or larger than a cross-section area of a connector coupling an active device.

In accordance with a further embodiment, a fuse structure comprises a cathode, a fuse link, an anode, a dielectric over the cathode, openings in the dielectric over the cathode, and metal connectors disposed in the openings. The fuse link is coupled between the cathode and the anode. The openings expose a portion of the cathode, and a cross-sectional area parallel to a top surface of the cathode of each of the openings is greater than a minimum feature size.

BRIEF DESCRIPTION OF THE DRAWINGS

For a more complete understanding of the present embodiments, and the advantages thereof, reference is now made to the following descriptions taken in conjunction with the accompanying drawings, in which:

FIG. 1 is an electrical fuse structure in accordance with an embodiment;

FIG. 2 is an electrical fuse structure in accordance with another embodiment;

FIGS. 6A-F are an illustrative process to form an electrical fuse structure in accordance with a further embodiment.

DETAILED DESCRIPTION OF ILLUSTRATIVE EMBODIMENTS

Figure 4:
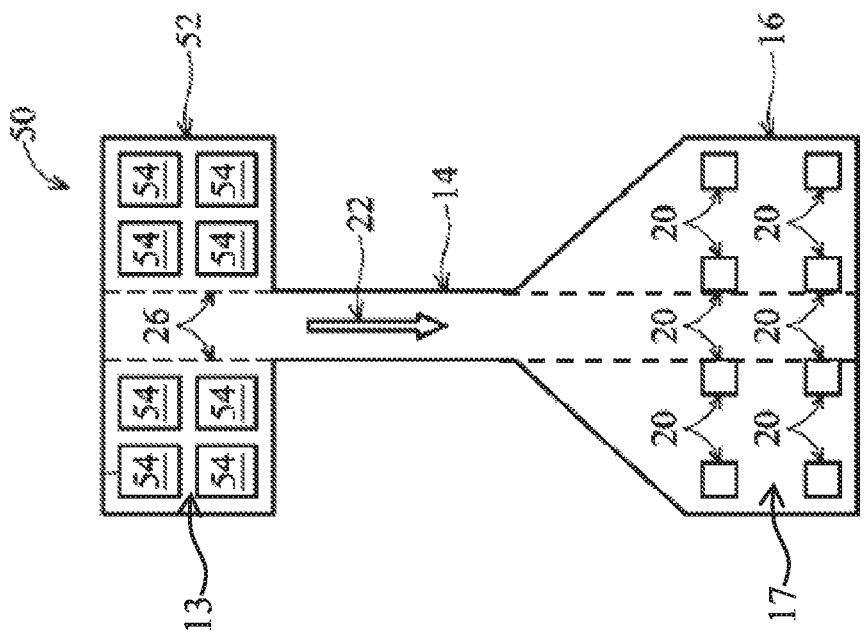
FIG. 4 is an electrical fuse structure in accordance with an additional embodiment.

The making and using of the present embodiments are discussed in detail below. It should be appreciated, however, that this disclosure provides many applicable inventive concepts that can be embodied in a wide variety of specific contexts. The specific embodiments discussed are merely illustrative of specific ways to make and use the invention, and do not limit the scope of the invention.

Embodiments will be described with respect to an electrical fuse structure in a semiconductor chip. Other embodiments contemplate applications where the use of an electrical fuse structure is desirable.

FIG. 1 depicts a fuse structure 10 comprising a cathode 12, a fuse link 14, and an anode 16. The fuse structure 10 may be formed of a metal, such as copper or the like, or silicided polysilicon, such as nickel silicide (NiSi), titanium silicide (TiSi2), cobalt silicide (CoSix), platinum silicide (PtSi2), or the like. Cathode 12 has a rectangular shaped top surface 13 and has two contacts 18 coupled to the top surface 13. Anode 16 has a funnel shaped top surface 17 and has contacts 20 coupled to the top surface 17. The contacts 18 and 20 may comprise copper, tungsten, or metals of the like, and may also comprise a diffusion barrier layer lining the contacts 18 and 20 comprising, for example, TiN, TaN, or the like. The fuse link 14 has a width (perpendicular to arrow 22) much smaller than the width of the cathode 12 and the anode 16. Although the description herein refers to contacts 18 and 20, these contacts may be vias and/or contacts.

Contacts 18 in the cathode 12 couple a larger surface area of the top surface of the cathode 12 than contacts coupling active devices in other portions of the chip, such as to a transistor gate, and the contacts 18 do not align or intersect a longitudinal axis through the fuse link 14 that is represented by the arrow 22. Some contacts 20 in the anode 16 do align or intersect the longitudinal axis through the fuse link 14. For example, dashed lines 26 illustrate longitudinal axes along edges of the fuse link 14 that define an area in the cathode 12, to which no contacts couple, and an area in the anode 16.

As a further exemplary embodiment and to further illustrate the embodiment in FIG. 1, examples of dimensions will be described with respect to a technology node of 32 nm, but the dimensions are not limiting with regard to embodiments described herein. One of ordinary skill in the art will appreciate that the dimensions may be varied according to different technology nodes. In an embodiment in a 32 nm technology node device, the contacts 20 in the anode 16 may be a contact or via, and may have a surface area width of about 40 nm and a length of about 40 nm. Thus, the area of contacts 20 may be square. The contacts 20 are said to be of a minimum feature size, which corresponds to the technology node of the embodiment, such as for gate electrodes, contacts, or metal lines. For example, a contact size may have a critical dimension of between about 15 nm and about 40 nm, and a via size may have a critical dimension of between about 20 nm and about 50 nm, each for a technology node of 32 nm. Thus, the contacts 20 may be equal to or larger than about the minimum feature size of a contact that couples an active device in another portion of the chip, such as to a transistor gate, or further, may be between about one times to about two times the minimum feature size of a contact that couples an active device in another portion of the chip. Minimum feature sizes for different technology nodes will have different critical dimensions.

The fuse link 14 may have a length of approximately 240 nm and a width of between about 40 nm and about 60 nm. Thus, the fuse link 14 width may be equivalent to or larger than about the minimum feature size of a gate electrode, or further, may be between about one times and about two times the minimum feature size of a gate electrode. Alternatively, the fuse link 14 width may be equivalent to or larger than about the minimum feature size of a width of a metal line, or further, may be between about one times and about two times the minimum feature size of the width of the metal line. The contacts 18 in the cathode 12 may have a surface area width of about 120 nm and a length of about 120 nm. Thus, the area of contacts 18 may be square, and may be equal to or greater than about two times the minimum feature size of a contact that couples an active device in another portion of the chip, or further, may range from about two times to about four times the minimum feature size of a contact coupling an active device. These dimensions may be varied according to, for example, a different technology node or according to different desires and needs of a design.

The arrow 22 also represents the direction of the flow of electrons when an electrical current is applied to the fuse structure 10. Thus, as is readily apparent to a person having ordinary skill in the art, the contacts 18 are equidistant to the fuse link 14 such that the resistances between the fuse link 14 and each of the contacts 18 may also be equal. The equal resistances may cause the current flowing through the fuse link 14 to be substantially evenly proportioned between each contact 18. This may reduce a large current that may be isolated to a single contact of the prior art. Further, the contact areas of the contacts 18 are substantially larger such that the current density in a single contact 18 may be reduced when an electrical current is applied to the fuse structure. The reduced magnitude of current and current density flowing through any single contact 18 generally causes the fuse structure to have a more robust electro-migration capability such that the metal in or above the contacts 18 are generally less likely to migrate to the fuse link 14 and short the fuse structure 10.

Figure 3:
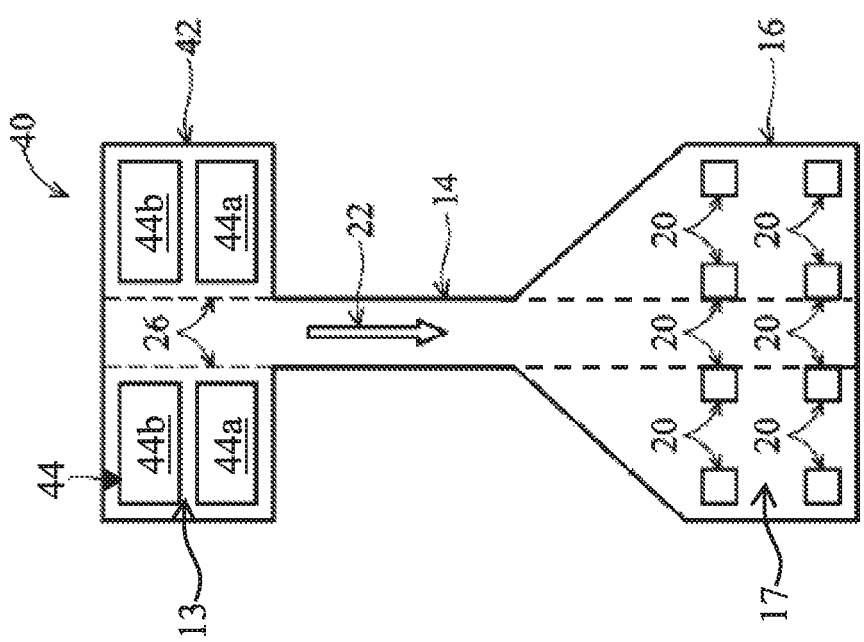
FIG. 3 is an electrical fuse structure in accordance with a further embodiment.

FIGS. 2 through 4 illustrate further embodiments. The embodiments in FIGS. 2 through 4 may be desirable when more contacts are needed for redundancy. FIG. 2 illustrates a fuse structure 30 comprising a cathode 32. The cathode 32 comprises a one-by-four array of inner and outer contacts 34a and 34b, respectively, which are referred to collectively as the contacts 34, which may also be vias. The contacts 34 again are not aligned with the fuse link 14 but are offset from the longitudinal axes of the fuse link. The inner contacts 34a are equidistant from a longitudinal axis of the fuse link 14, or from the area defined by dashed lines 26, and outer contacts 34b are equidistant from the longitudinal axis. The anode 16 includes the contacts 20 as configured in FIG. 1, where a portion of contacts 20 are aligned with the longitudinal axes. The contacts 34 have a contact surface area that is larger. The contacts 34 may each be approximately 120 nm in length and about 60 nm in width, although other dimensions may be used.

FIG. 3 illustrates a fuse structure 40 comprising a cathode 42. The cathode 42 comprises a two-by-two array of contacts 44, which may also be vias. The contacts 44 again are not aligned with the fuse link 14 and have a relatively larger contact surface area. The two contacts 44a more proximate the fuse link 14 are equidistant from a respective longitudinal axis of the fuse link 14, and the two contacts 44b furthest from the fuse link 14 are equidistant from a respective longitudinal axis. The contacts may each be approximately 60 nm in length and about 120 nm in width, but other dimensions are contemplated within scopes of this embodiment. The anode 16 again includes the contacts 20 as configured in FIG. 1, where a portion of contacts 20 are aligned with the longitudinal axes.

FIG. 4 illustrates a fuse structure 50 comprising a cathode 52. The cathode 52 comprises a two-by-four array of contacts 54, which may also be vias. The contacts 54 are likewise not aligned with the fuse link 14 and have a relatively larger contact surface area. Pairs of corresponding contacts 54 are equidistant from a respective longitudinal axis of the fuse link 14. Contacts 54 are symmetrically arranged on opposing sides of the longitudinal axes of the fuse link 14. The contacts 54 may each be approximately 60 nm in length and about 60 nm in width, but the dimensions may be varied. The anode 16 again includes the contacts 20 as configured in FIG. 1, where a portion of contacts 20 are aligned with the longitudinal axes.

Figure 5A:
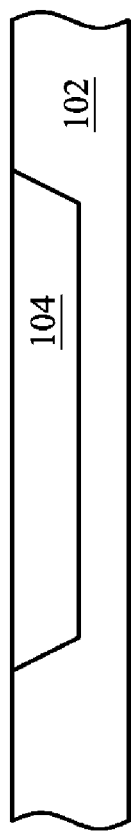
FIGS. 5A-F are an exemplary process to form an electrical fuse structure in accordance with an embodiment.

FIGS. 5A through 5F illustrate an exemplary method to form a fuse structure in accordance with embodiments. These figures illustrate a cross-section of a cathode of the fuse structure, for example, the cathode 12 in FIG. 1 along line A-A. In FIG. 5A, a semiconductor substrate 102 is provided, such as silicon, silicon-germanium, or the like. A recess is etched in the semiconductor substrate 102, and a dielectric is formed in the recess to create a shallow trench isolation (STI) 104. The dielectric may be formed by oxidizing the semiconductor substrate 102, by depositing the dielectric over the semiconductor substrate 102, or similar techniques.

Figure 5B:
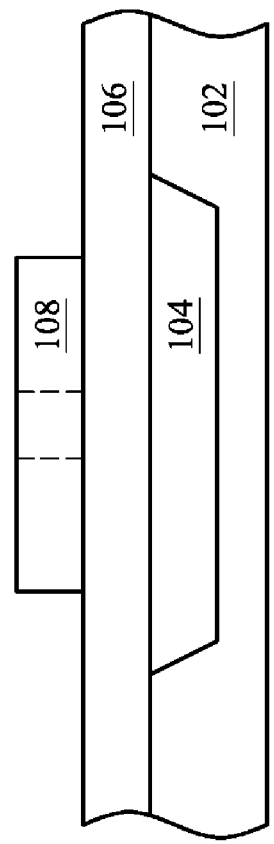

In FIG. 5B, a metal or polysilicon layer 106 is formed over the semiconductor substrate 102, such as by a blanket deposition. If metal is used, the metal layer 106 may comprise copper or the like. A photoresist 108 is then formed above the metal or polysilicon layer 106 that is above the STI 104. The top surface of the photoresist 108 is patterned similar to the top surface illustrated in FIGS. 1 through 4. The dashed lines in the photoresist 108 indicate the width of a fuse link in the subsequent fuse structure.

Figure 5C:
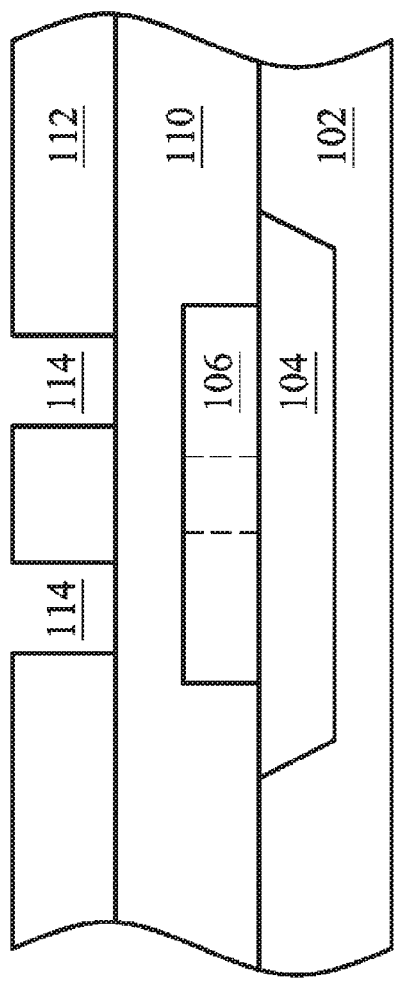

In FIG. 5C, an etch process is carried out such that the pattern of the photoresist 108 is imposed on the metal or polysilicon layer 106. The dashed lines in the metal or polysilicon layer 106 show the width of a fuse link coupled to the cathode. If polysilicon is used in the metal or polysilicon layer 106, the polysilicon then may be silicided by depositing a metal, such as titanium, cobalt, nickel, platinum, or the like, and annealing the structure to create titanium silicide, cobalt silicide, nickel silicide, platinum silicide, or other similar silicides. Then, a dielectric layer 110, such as an interlayer dielectric (ILD), is deposited over the semiconductor substrate 102. A photoresist 112 is deposited over the dielectric layer 110 and patterned to expose portions of the dielectric layer 110 over the remaining metal or polysilicon layer 106 through openings 114.

Figure 5D:
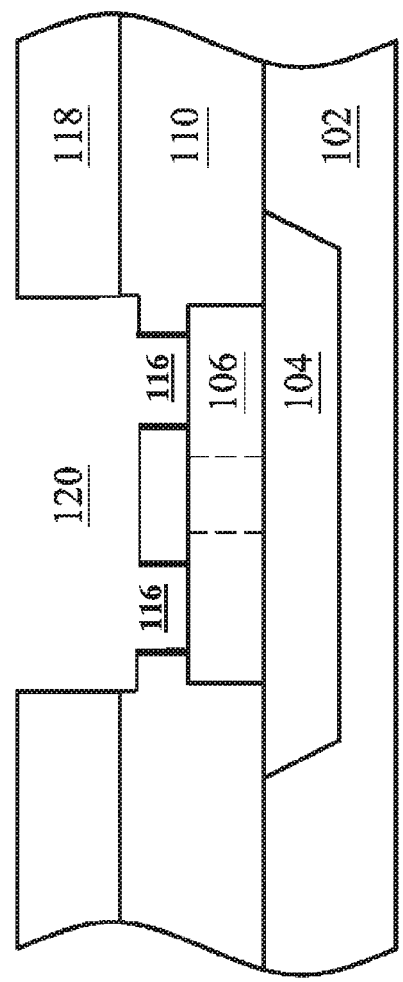

In FIG. 5D, an etch process is carried out to impose the pattern of openings 114 into the dielectric layer 110 to form openings 116. Another photoresist 118 is then formed over the dielectric layer 110 with an opening 120 patterned therein. An isotropic etch is then carried out to form an opening in the dielectric layer 110 so that contacts subsequently formed in openings 116 are coupled together. This process thus describes the use of a dual damascene process. However, embodiments are not limited to this process, and a person having ordinary skill in the art will readily understand the efficacy of a single damascene process or other like processes.

Figure 5E:
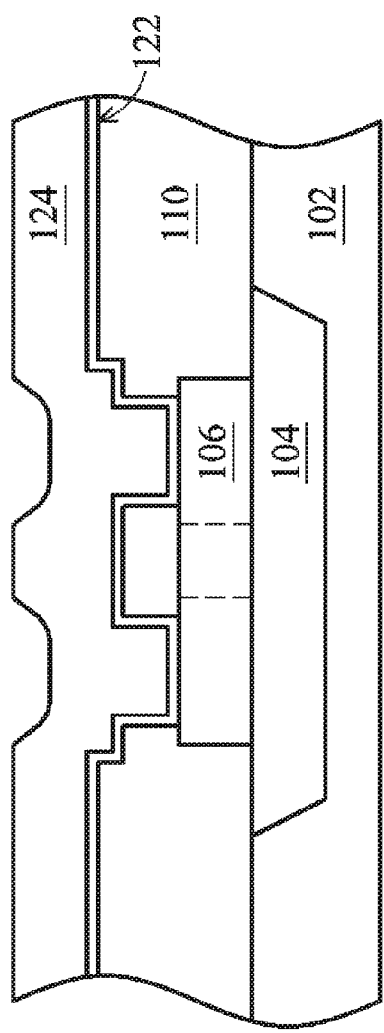

In FIG. 5E, a conformal diffusion barrier layer 122 is deposited over the structure and a metal 124 is deposited over the diffusion barrier layer 122. The diffusion barrier layer 122 may be any known barrier layer, such as titanium nitride, tantalum nitride, or the like. The metal 124 may be copper, tungsten, or the like.

Figure 5F:
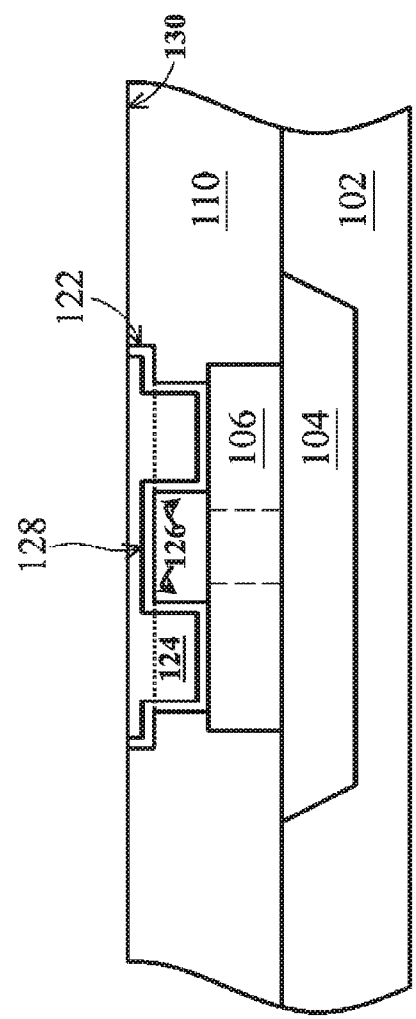

In FIG. 5F, excess metal 124 is removed, and diffusion barrier layer 122 over the dielectric layer 110 that is not within any of the formed openings is removed, such as by a chemical mechanical polish (CMP). Accordingly, contacts 126 are formed coupling the metal or polysilicon layer 106 that is the cathode, and line 128 couples the contacts 126 together and forms an area to which vias in subsequent intermetal dielectric (IMD) layers may be coupled. It is noted that line 128 is not depicted in FIG. 1. The contacts 126 thus formed have a larger contact area and are not aligned with any fuse link, as indicated by the dashed lines. This process may result in the layout of the fuse structure 10 as illustrated in FIG. 1, but a person having ordinary skill in the art will readily understand any needed modifications to this process to form other embodiments, such as those in FIGS. 2 through 4.

Figure 6A:
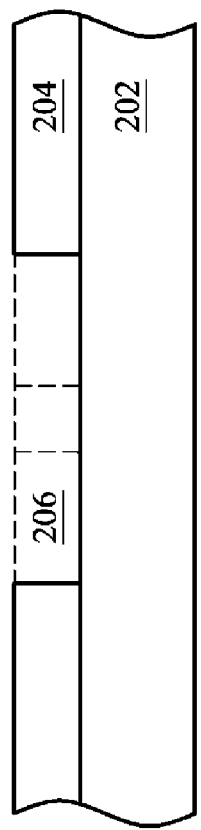

FIGS. 6A through 6F illustrate another exemplary method to form a fuse structure in accordance with embodiments. These figures illustrate a cross-section of a cathode of the fuse structure, for example, the cathode 12 in FIG. 1 along line A-A. In FIG. 6A, a first dielectric layer 202 is provided, such as silicon dioxide, silicon nitride, silicon oxynitride, or the like. The first dielectric layer 202 may be formed above a semiconductor substrate, such as part of an interlayer dielectric (ILD) or intermetal dielectric (IMD) layer in a semiconductor chip. A photoresist 204 is patterned over the first dielectric layer 202 with opening 206 therein. The opening 206 is patterned similar to the top surface illustrated in FIGS. 1 through 4. The vertical dashed lines in the photoresist 204 indicate the width of a fuse link in the subsequent fuse structure, and the horizontal dashed lines show the top surface of the photoresist 204 around other areas of opening 206.

Figure 6B:
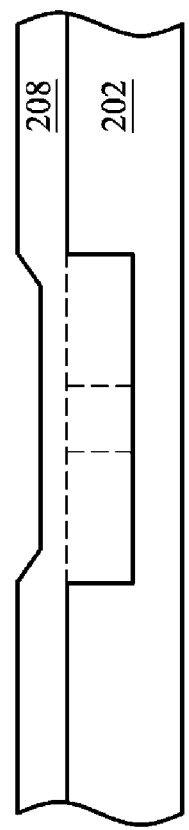

In FIG. 6B, the first dielectric layer 202 is etched such that opening 206 is imposed into the dielectric layer 202. A metal or polysilicon layer 208 is formed over the first dielectric layer 202, such as by a blanket deposition. If metal is used, the metal layer 208 may comprise copper or the like. Any excess metal or polysilicon is then removed, such as by a chemical mechanical polish (CMP). If polysilicon is used as a polysilicon layer 208, a metal, such as titanium, cobalt, nickel, platinum, or the like, may be deposited over the polysilicon and annealed to form a silicide, such as titanium silicide, cobalt silicide, nickel silicide, platinum silicide, or other similar silicides.

In FIG. 6C, a second dielectric layer 210 is deposited over the first dielectric layer 202 and the metal or polysilicon 208. The second dielectric layer 210 may be a subsequent ILD or IMD layer. A photoresist 212 is deposited over the second dielectric layer 210 and patterned to expose portions of the dielectric layer 210 over the remaining metal or polysilicon layer 208 through openings 214.

In FIG. 6D, an etch process is carried out to impose the pattern of openings 214 into the second dielectric layer 210 to form openings 218. Another photoresist 216 is then formed over the second dielectric layer 210 with an opening 220 patterned therein. An isotropic etch is then carried out to form an opening in the second dielectric layer 210 so that contacts subsequently formed in openings 218 are coupled together. This process thus describes the use of a dual damascene process. However, embodiments are not limited to this process, and a person having ordinary skill in the art will readily understand the efficacy of a single damascene process or other like processes.

Figure 6E:
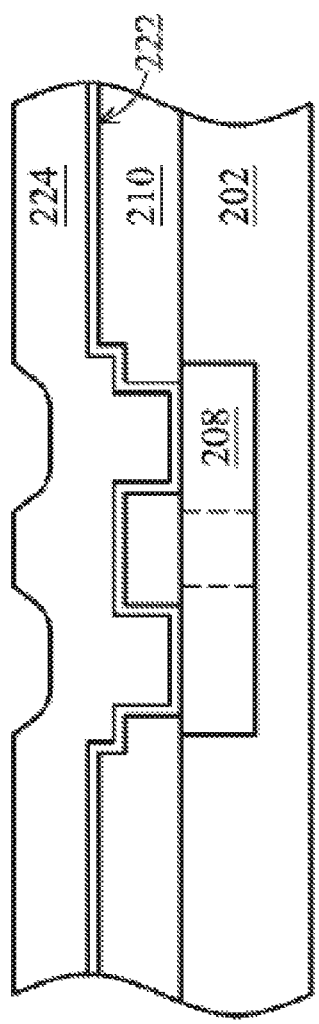

In FIG. 6E, a conformal diffusion barrier layer 222 is deposited over the structure and a metal 224 is deposited over the diffusion barrier layer 222. The diffusion barrier layer 222 may be any known barrier layer, such as titanium nitride, tantalum nitride, or the like. The metal 224 may be copper, tungsten, or the like.

Figure 6F:
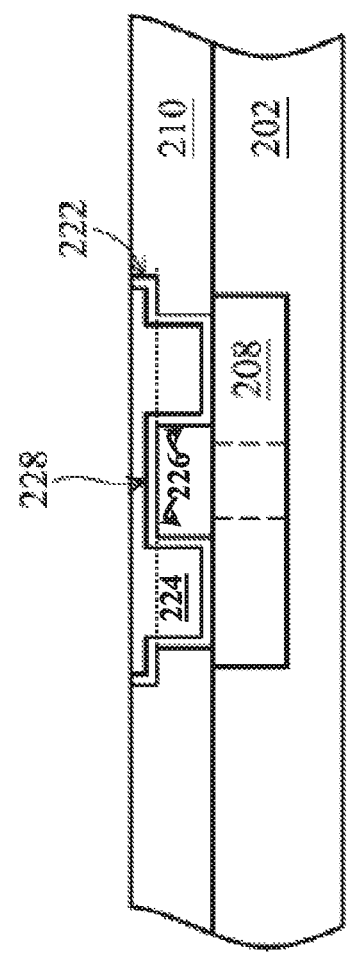

In FIG. 6F, excess metal 224 is removed, and diffusion barrier layer 222 over the second dielectric layer 210 that is not within any of the formed openings is removed, such as by a chemical mechanical polish (CMP). Accordingly, vias 226 are formed coupled to the metal or polysilicon layer 206 that is the cathode, and line 228 couples the vias 226 together and forms an area to which vias in subsequent IMD layers may be coupled. It is noted that line 228 is not depicted in FIG. 1. The vias 226 thus formed have a larger contact area and are not aligned with any fuse link, as indicated by the dashed lines. This process may result in the layout of the fuse structure 10 illustrated in FIG. 1, but a person having ordinary skill in the art will readily understand any needed modifications to this process to form other embodiments, such as those in FIGS. 2 through 4.

Although these embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electrical device comprising:
an anode having a plurality of anode connectors coupled thereto;
a cathode having a first cathode connector and a second cathode connector coupled thereto;
a fuse link extending between the anode and the cathode, such that the fuse link connects the anode and the cathode, wherein the fuse link has a width defined between a first edge and a second edge, and further wherein the first edge and the second edge extend a length of the fuse link;
wherein the cathode includes a central region defined by a first longitudinal axis and a second longitudinal axis extending respectively from the first edge and the second edge of the fuse link, the first longitudinal axis and the second longitudinal axis extending a length of the cathode; and
wherein the first cathode connector does not intersect the first longitudinal axis and the second cathode connector does not intersect the second longitudinal axis, the central region is free of the first cathode connector and the second cathode connector, and the first cathode connector and the second cathode connector are equidistant respectively to the fuse link.

2. The electrical device of claim 1, wherein the first cathode connector and the second cathode connector each have a surface area greater than a surface area of each of the plurality of anode connectors.

3. The electrical device of claim 1, wherein each of the first cathode connector and the second cathode connector has a surface area greater than that of each of the plurality of anode connectors.

4. The electrical device of claim 1, wherein:
each of the plurality of anode connectors has a first width;
each of the first cathode connector and the second cathode connector has a second width; and
the first width is less than the width of the fuse link, and the second width is greater than the width of the fuse link.

5. The electrical device of claim 1, further comprising a line coupling the first cathode connector and the second cathode connector, wherein the line extends over the central region of the cathode without contacting the central region.

6. The electrical device of claim 5, wherein the line, the first cathode connector, and the second cathode connector include a diffusion barrier layer that extends along surfaces defining the line, the first cathode connector, and the second cathode connector.

7. The electrical device of claim 1, wherein the first cathode connector and the second cathode connector are configured to achieve a resistance between the fuse link and the first cathode connector that is substantially equal to a resistance between the fuse link and the second cathode connector.

8. A fuse structure comprising:
an anode;
a cathode;
a fuse link extending between and electrically coupling the anode and the cathode;
a plurality of anode contacts coupled to the anode, wherein the plurality of anode contacts are configured in a first arrangement; and
a plurality of cathode contacts coupled to the cathode, wherein the plurality of cathode contacts are configured in a second arrangement that is different than the first arrangement, wherein each of the plurality of cathode contacts configured in the second arrangement are spaced a distance from an area defined between longitudinal axes vertically aligned with edges of the fuse link, and further wherein the plurality of cathode contacts configured in the second arrangement are equidistant from the fuse link, such that resistances between the fuse link and each of the plurality of cathode contacts are substantially equal.

9. The fuse structure of claim 8, wherein: each of the plurality of anode contacts has a first surface area,
each of the plurality of cathode contacts has a second surface area, and
the first surface area is less than the second surface area.

10. The fuse structure of claim 9, wherein the distance is a first distance and the area is a first area, and further wherein at least one of the plurality of anode contacts configured in the first arrangement is not spaced a second distance from a second area defined between the longitudinal axes vertically aligned with the edges of the fuse link.

11. The fuse structure of claim 8, wherein the anode has a funnel shaped top surface, and the cathode has a rectangular shaped top surface.

12. The fuse structure of claim 8, wherein each of the plurality of anode contacts has a width than that of each of the plurality of cathode contacts.

13. A structure comprising:
a fuse structure including a fuse link extending between an anode and a cathode, the fuse link having an electron flow path defined between a first longitudinal axis and a second longitudinal axis, the electron flow path extends a length of the fuse structure;
a plurality of anode contacts coupled with the anode, wherein a first one of the plurality of anode contacts is not spaced a first distance from the first longitudinal axis and a second one of the plurality of anode contacts is not spaced a second distance from the second longitudinal axis; and
a cathode contact pair coupled with the cathode, wherein the cathode contact pair includes a first cathode contact and a second cathode contact, and further wherein the first cathode contact is spaced a third distance from the first longitudinal axis and the second cathode contact is spaced a fourth distance from the second longitudinal axis,
wherein the third distance and the fourth distance configure the first cathode contact and the second cathode contact equidistant respectively from the fuse link.

14. The structure of claim 13, wherein each of the first cathode contact and the second cathode contact has an area about two times to about four times a minimum contact feature size.

15. The structure of claim 13, wherein each of the first cathode contact and the second cathode contact includes a diffusion barrier layer and a metal layer disposed over the diffusion barrier layer.

16. The structure of claim 15, wherein the fuse structure, the first cathode contact, and the second cathode contact are disposed in a dielectric layer.

17. The structure of claim 13, wherein the fuse link extends between the anode and the cathode along a first direction and spans a first dimension along a second direction orthogonal to the first direction;
- each of the plurality of anode contacts spans a second dimension along the second direction;
- each of the first cathode contact and the second cathode contact spans a third dimension along the second direction; and
- the second dimension is less than the first dimension, and the third dimension is greater than the first dimension.

18. The structure of claim 13, wherein the anode has a funnel shaped top surface and the cathode has a rectangular shaped top surface.

19. The structure of claim 13, further comprising:
- a shallow trench isolation (STI) feature disposed in a substrate, wherein the fuse structure is disposed on the STI feature; and
- a dielectric layer disposed over the substrate, wherein the fuse structure and the cathode contact pair are disposed in the dielectric layer.

* * * * *